US008038905B2

(12) United States Patent
Mueller-Mach et al.

(10) Patent No.: US 8,038,905 B2
(45) Date of Patent: Oct. 18, 2011

(54) ILLUMINATION SYSTEM COMPRISING A RADIATION SOURCE AND A FLUORESCENT MATERIAL

(75) Inventors: Regina Mueller-Mach, San Jose, CA (US); Gerd Mueller, San Jose, CA (US); Jorge Meyer, Aachen (DE); Peter J. Schmidt, Aachen (DE); Walter Mayr, Alsdorf (DE); Hans-Dieter Bausen, Aachen (DE)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 0 days.

(21) Appl. No.: 12/963,844

(22) Filed: Dec. 9, 2010

(65) Prior Publication Data
US 2011/0084232 A1 Apr. 14, 2011

Related U.S. Application Data

(62) Division of application No. 11/371,883, filed on Mar. 8, 2006.

(30) Foreign Application Priority Data

Mar. 9, 2005 (EP) .................... 05101834

(51) Int. Cl.
*C09K 11/00* (2006.01)
(52) U.S. Cl. ................................ 252/301.4 F
(58) Field of Classification Search ............. 252/301.4 F
See application file for complete search history.

(56) References Cited

U.S. PATENT DOCUMENTS

| 6,576,488 | B2 | 6/2003 | Collin, III et al. |
| 6,649,946 | B2 | 11/2003 | Bogner et al. |
| 6,650,044 | B1 | 11/2003 | Lowery |
| 6,696,703 | B2 | 2/2004 | Mueller-Mach et al. |
| 7,138,756 | B2 | 11/2006 | Gotoh et al. |
| 7,273,568 | B2 | 9/2007 | Nagatomi et al. |
| 7,432,647 | B2 | 10/2008 | Nagatomi et al. |
| 7,514,721 | B2 | 4/2009 | Krames et al. |
| 2003/0030368 | A1 | 2/2003 | Ellens et al. |
| 2003/0094893 | A1 | 5/2003 | Ellens et al. |
| 2003/0168643 | A1 | 9/2003 | Mitomo et al. |
| 2005/0184638 | A1 | 8/2005 | Mueller et al. |
| 2005/0189863 | A1 | 9/2005 | Nagatomi et al. |
| 2005/0269582 | A1 | 12/2005 | Mueller et al. |

FOREIGN PATENT DOCUMENTS

| EP | 1413619 A1 | 4/2004 |
| EP | 1445295 A1 | 8/2004 |
| EP | 1568753 A2 | 8/2005 |
| JP | 2004-107623 A | 4/2004 |
| JP | 2004-182780 | 7/2004 |
| JP | 2004-363343 A | 12/2004 |
| WO | 20050052087 A1 | 6/2005 |
| WO | 2005103199 A1 | 11/2005 |

OTHER PUBLICATIONS

K. Uheda et al, "The Crystal Structure and Photoluminescence Properties of a New Red Phosphor, Calcium, Aluminum Silicon Nitride Doped With Divalent Europium", ABS. 2073, 206th Meeting, 2004 The Electrochemical Society, Inc. 1 Page.

*Primary Examiner* — Carol M Koslow

(57) ABSTRACT

The invention concerns an illumination system for generation of colored, especially amber or red light, comprising a radiation source and a fluorescent material comprising at least one phosphor capable of absorbing a part of light emitted by the radiation source and emitting light of wavelength different from that of the absorbed light; wherein said at least one phosphor is a amber to red emitting a rare earth metal-activated oxonitridoalumosilicate of general formula $(Ca_{1-x-y-z}Sr_xBa_yMg_z)_{1-n}(Al_{1-a+b}B_a)Si_{1-b}N_{3-b}O_b:Re_n$, wherein $0 \leq x \leq 1$, $0 \leq y \leq 1$, $0 \leq z \leq 1$, $0 \leq a \leq 1$, $0 < b \leq 1$ and $0.002 \leq n \leq 0.2$ and RE is selected from europium(II) and cerium(III).

3 Claims, 3 Drawing Sheets

ILLUMINATION SYSTEM COMPRISING A RADIATION SOURCE AND A FLUORESCENT MATERIAL

This is a divisional of prior application Ser. No. 11/371,883 filed Mar. 8, 2006 and is incorporated by reference herein.

BACKGROUND

1. Field of Invention

The present invention generally relates to an illumination system comprising a radiation source and a fluorescent material comprising an amber to red phosphor. The invention also relates to an amber to red phosphor for use in an illumination system. More particularly, the invention relates to an illumination system comprising an electroluminescent semiconductor device as radiation source and a fluorescent material comprising a phosphor for the generation of specific, white or colored light, including yellow, amber and red light. In this illumination system white or colored light is generated by luminescent down conversion and additive color mixing based on an ultraviolet or blue primary radiation. A solid-state light-emitting diode as a source of primary radiation is especially contemplated.

2. Description of Related Art

Various illumination systems for vehicular and signaling usage are known. Vehicles include a number of different components and assemblies that have an illuminator or a signal lamp associated therewith. Great interest has been shown in the use of electroluminescent semiconductor devices, such as solid-state light emitting diodes (LEDs), as illuminators and signal indicators because they offer many potential advantages as compared to other conventional low voltage light sources. Other light sources suffer from deficiencies, including relative inefficiency, such as is the case with conventional tungsten incandescent lamps; high operating voltages, such as is the case with fluorescent and gas discharge lamps; or susceptibility to damage, such as is the case with incandescent lamps.

Accordingly, these alternate light sources are not optimal for vehicular applications where only limited power or low voltage is available, or where high voltage is unacceptable for safety reasons, or in applications where there is significant shock or vibration. LEDs on the other hand are highly shock resistant, and therefore provide significant advantages over incandescent and fluorescent bulbs, which can shatter when subjected to mechanical or thermal shock. LEDs also possess operating lifetimes from 200,000 hours to 1,000,000 hours, as compared to the typical 1,000 to 2,000 hours for incandescent lamps or 5,000 to 10,000 hours for fluorescent lamps.

Current yellow, amber or red traffic and vehicular lights comprising an electroluminescent semiconductor device, rely on direct excitation of aluminum gallium indium phosphide (AlGaInP) LED chips for generation of colored yellow, amber or red light.

A drawback of AlInGaP LEDs is the quenching of the light emission with increasing temperature. Their light output drops by more than 40% if the temperature is raised from room temperature to 100° C. At the same time the spectrum shifts, e.g. from 617 nm to 623 nm, which reduces the luminous efficacy further. Therefore, there is a strong demand by the automotive industry for yellow to red LEDs with a much smaller dependence of the light yield and emission spectrum on temperature.

One presently discussed solution for generation of yellow, amber or red light is the application of white LEDs and an appropriate colour filter, since the AlInGaN chips applied in white LEDs show much less thermal quenching. In addition, the spectral shift of white LEDs with temperature is less severe due to the application of the YAG:Ce phosphor. However, the major drawback of this concept is the low efficiency due to the fact that the present white LEDs emit only a few percent orange to red light and most of the white LED spectrum is cut off.

Another approach is known, e.g. from U.S. Pat. No. 6,649,946 wherein a light source for generating of yellow to red light by using a yellow-to-red-emitting phosphor is disclosed. Said phosphor has a host lattice of the nitridosilicate type $M_xSi_yN_z$:Eu, wherein M is at least one of an alkaline earth metal chosen from the group Ca, Sr, Ba, Zn and wherein $z=\frac{2}{3}x+\frac{4}{3}y$. The phosphor can be used to create a highly stable red or orange or yellow emitting LED which may be based on a primary light source (preferably InGaN-chip) of peak emission around 380 to 480 nm whose light is fully converted by a nitride phosphor of the inventive type rare-earth activated silicon nitrides doped with Eu. These LEDs show higher efficiency and improved stability compared to well-known commercial LEDs with direct excitation of yellow to red colors.

Yet, a recent evaluation of the chromaticity requirements for traffic signs has indicated that the red color range of vehicular and traffic signs should include a longer-wavelength cut-off to ensure detection of the signal by color vision deficient drivers.

Therefore, there is a need to provide an illumination system comprising phosphors that are excitable by a radiation source of the near UV-to-blue range and emit in the visible amber to deep-red range.

SUMMARY

Thus the present invention provides an illumination system, comprising a radiation source and a fluorescent material comprising at least one phosphor capable of absorbing a part of light emitted by the radiation source and emitting light of wavelength different from that of the absorbed light; wherein said at least one phosphor is a rare earth metal-activated oxonitridoalumosilicate of general formula $(Ca_{1-x-y-z}Sr_x Ba_y Mg_z)_{1-n}(Al_{1-a+b}B_a)Si_{1-b}N_{3-b}O_b:Re_n$, wherein $0 \leq x \leq 1$, $0 \leq y \leq 1$, $0 \leq z \leq 1$, $0 \leq a \leq 1$, $0 < b \leq 1$ and $0.002 \leq n \leq 0.2$ and RE is selected from europium(II) and cerium(III).

An illumination system according to the present invention can provide a composite colored output light, especially amber or red light with a high temperature resistance, color point stability and a high efficiency at the same time.

In particular, the composite output light has a greater amount of emission in the deep red color range than the conventional lamp and enlarges the range of colors that can be reproduced. This characteristic makes the device ideal for applications, such as yellow, amber and red traffic lighting, stair/exit ramp lighting, decorative lighting and signal lighting for vehicles.

An illumination system according to the present invention can also provide a composite white output light that is well balanced with respect to color. In particular, the composite white output light has a greater amount of emission in the red color range than the conventional lamp. This characteristic makes the device ideal for applications in which a true color rendition is required. Such applications of the invention include, inter alia, traffic lighting, street lighting, security lighting and lighting of automated factories.

Especially contemplated as the radiation source is a solid-state light emitting diode. According to a first aspect of the invention a light illumination system comprises a blue-light emitting diode having a peak emission wavelength in the range of 420 to 495 nm as a radiation source and a fluorescent material comprising at least one phosphor, that is a rare earth metal-activated oxonitridoalumosilicate of general formula $(Ca_{1-x-y-z}Sr_xBa_yMg_z)_{1-n}(Al_{1-a+b}B_a)Si_{1-b}N_{3-b}O_b:RE_n$, wherein $0 \leq x \leq 1$, $0 \leq y \leq 1$, $0 \leq z \leq 1$, $0 \leq a \leq 1$, $0 < b \leq 1$ and $0.002 \leq n \leq 0.2$ and RE is selected from europium(II) and cerium(III).

Such illumination system will provide white or colored, especially amber or red light in operation. The blue light emitted by the LED excites the phosphor, causing it to emit amber or red light. The blue light emitted by the LED is transmitted through the phosphor and is mixed with the amber or red light emitted by the phosphor. The viewer perceives the mixture of blue and amber light as white or colored light, depending on the amount of phosphor present in the fluorescent material.

According to one embodiment the invention provides a white or colored, especially amber or red light illumination system comprising a blue-light emitting diode having a peak emission wavelength in the range of 420 to 495 nm as a radiation source and a fluorescent material comprising a rare earth metal-activated oxonitridoalumosilicate of general formula $(Ca_{1-x-y-z}Sr_xBa_yMg_z)_{1-n}(Al_{1-a+b}B_a)Si_{1-b}N_{3-b}O_b:RE_n$, wherein $0 \leq x \leq 1$, $0 \leq y \leq 1$, $0 \leq z \leq 1$, $0 \leq a \leq 1$, $0 < b \leq 1$ and $0.002 \leq n \leq 0.2$ and RE is selected from europium(II) and cerium(III) and at least one second phosphor.

When the fluorescent material comprises a phosphor blend of a phosphor of the rare earth metal-activated oxonitridoalumosilicate type and at least one second phosphor the color rendition of the white or colored light illumination system according to the invention may be further improved.

In particular, the fluorescent material may be a phosphor blend, comprising a rare earth metal-activated oxonitridoalumosilicate of general formula $(Ca_{1-x-y-z}Sr_xBa_yMg_z)_{1-n}(Al_{1-a+b}B_a)Si_{1-b}N_{3-b}O_b:RE_n$, wherein $0 \leq x \leq 1$, $0 \leq y \leq 1$, $0 \leq z \leq 1$, $0 \leq a \leq 1$, $0 < b \leq 1$ and $0.002 \leq n \leq 0.2$ and RE is selected from europium(II) and cerium(III) and a red phosphor. Such red phosphor may be selected from the group of $Ca_{1-x-y}Sr_xS:Eu_y$, wherein $0 \leq x \leq 1$ and $0 < y \leq 0.2$; and $(Sr_{1-x-y}Ba_xCa_y)_2Si_5N_8:Eu_z$ wherein $0 \leq x \leq 1$, $0 \leq y \leq 1$ and $0 < z \leq 0.2$.

Otherwise the fluorescent material may be a phosphor blend, comprising a rare earth metal-activated oxonitridoalumosilicate of general formula $(Ca_{1-x-y-z}Sr_xBa_yMg_z)_{1-n}(Al_{1-a+b}B_a)Si_{1-b}N_{3-b}O_b:RE_n$, wherein $0 \leq x \leq 1$, $0 \leq y \leq 1$, $0 \leq z \leq 1$, $0 \leq a \leq 1$, $0 < b \leq 1$ and $0.002 \leq n \leq 0.2$ and RE is selected from europium(II) and cerium(III) and a yellow-to-green phosphor. Such yellow-to-green phosphor may be selected from the group comprising $(Ca_xSr_{1-x-y})_2SiO_4:Eu_y$, wherein $0 \leq x \leq 1$ and $0 < y \leq 0.2$, $(Sr_xBa_{1-x-y})_2SiO_4:Eu_y$, wherein $0 \leq x \leq 1$ and $0 < y \leq 0.2$, $(Sr_{1-x-y}Ba_x)Ga_2S_4:Eu_y$ wherein $0 \leq x \leq 1$ and $0 < y \leq 0.2$, $(Y_{1-x-y-z}Gd_xLu_z)_3(Al_{1-a}Ga_a)_5O_{12}:Ce_y$, wherein $0 \leq x \leq 1$ and $0 < y \leq 0.2$, $0 \leq z \leq 1$, $0 \leq a \leq 0.5$, ZnS:Cu, CaS:Ce, Cl, and $SrSi_2N_2O_2$:Eu.

The emission spectrum of such a fluorescent material comprising additional phosphors has the appropriate wavelengths to obtain together with the blue light of the LED and the amber to red light of the rare earth metal-activated oxonitridoalumosilicate type phosphor according to the invention a high quality colored light with good color rendering at the required color temperature.

According to another aspect of the invention there is provided a white or colored especially amber or red light illumination system, wherein the radiation source is selected from the light emitting diodes having an emission with a peak emission wavelength in the UV-range of 200 to 400 nm and the fluorescent material comprises at least one phosphor, that is a rare earth metal-activated oxonitridoalumosilicate of general formula $(Ca_{1-x-y-z}Sr_xBa_yMg_z)_{1-n}(Al_{1-a+b}B_a)Si_{1-b}N_{3-b}O_b:RE_n$, wherein $0 \leq x \leq 1$, $0 \leq y \leq 1$, $0 \leq z \leq 1$, $0 \leq a \leq 1$, $0 < b \leq 1$ and $0.002 \leq n \leq 0.2$ and RE is selected from europium(II) and cerium(III).

According to one embodiment the invention provides a white light illumination system comprising a blue-light emitting diode having a peak emission wavelength in the UV-range of 200 to 420 nm as a radiation source and a fluorescent material comprising a rare earth metal-activated oxonitridoalumosilicate of general formula $(Ca_{1-x-y-z}Sr_xBa_yMg_z)_{1-n}(Al_{1-a+b}B_a)Si_{1-b}N_{3-b}O_b:RE_n$, wherein $0 \leq x \leq 1$, $0 \leq y \leq 1$, $0 \leq z \leq 1$, $0 \leq a \leq 1$, $0 < b \leq 1$ and $0.002 \leq n \leq 0.2$ and RE is selected from europium(II) and cerium(III) and at least one second phosphor.

In particular, the fluorescent material may be a phosphor blend, comprising a rare earth metal-activated oxonitridoalumosilicate of general formula $(Ca_{1-x-y-z}Sr_xBa_yMg_z)_{1-n}(Al_{1-a+b}B_a)Si_{1-b}N_{3-b}O_b:RE_n$, wherein $0 \leq x \leq 1$, $0 \leq y \leq 1$, $0 \leq z \leq 1$, $0 \leq a \leq 1$, $0 < b \leq 1$ and $0.002 \leq n \leq 0.2$ and RE is selected from europium(II) and cerium(III) and a blue phosphor. Such blue phosphor may be selected from the group comprising $BaMgAl_{10}O_{17}$:Eu, $Ba_5SiO_4(Cl,Br)_6$:Eu, $CaLa_2S_4$:Ce, $(Sr,Ba,Ca)_5(PO_4)_3Cl$:Eu and $LaSi_3N_5$:Ce.

The emission spectrum of such a fluorescent material comprising additional phosphors has the appropriate wavelengths to obtain together with the blue light of the LED and the amber to red light of the rare earth metal-activated oxonitridoalumosilicate type phosphor according to the invention a high quality colored light with good color rendering at the required color temperature.

Another aspect of the present invention provides a phosphor capable of absorbing a part of light emitted by the radiation source and emitting light of wavelength different from that of the absorbed light; wherein said phosphor is a rare earth metal-activated oxonitridoalumosilicate of general formula $(Ca_{1-x-y-z}Sr_xBa_yMg_z)_{1-n}(Al_{1-a+b}B_a)Si_{1-b}N_{3-b}O_b:RE_n$, wherein $0 \leq x \leq 1$, $0 \leq y \leq 1$, $0 \leq z \leq 1$, $0 \leq a \leq 1$, $0 < b \leq 1$ and $0.002 \leq n \leq 0.2$ and RE is selected from europium(II) and cerium(III).

By varying the chemical composition of the phosphor, the phosphor color can be shifted from amber to a deep red. The emission spectra extend in relatively inaccessible regions of the spectrum, including the deep red and near infrared.

The fluorescent material is excitable by UV-A emission lines which have such wavelengths as from 300 nm to 400 nm, but is excited also with high efficiency by blue light emitted by a blue light emitting diode having a wavelength around 400 to 495 nm. Thus the fluorescent material has ideal characteristics for conversion of blue light of nitride semiconductor light emitting component into white or colored light. These phosphors are broadband emitters wherein the visible emission is so broad that there is no 80 nm wavelength range where the visible emission is predominantly located. Total conversion efficiency can be up to 98%.

Additional important characteristics of the rare earth metal-activated oxonitridoalumosilicate type phosphors include 1) resistance to thermal quenching of 30 luminescence at typical device operating temperatures (e.g. 80° C.); 2) lack of interfering reactivity with the encapsulating resins used in the device fabrication; 3) suitable absorptive profiles to minimize dead absorption within the visible spectrum; 4) a temporally stable luminous output over the operating lifetime of the device and; 5) compositionally controlled tuning of the phosphors excitation and emission properties. These rare earth metal-activated oxonitridoalumosilicate type phosphors may also include ytterbium, praseodymium, samarium and other cations including mixtures of cations as co-activators.

The phosphors may have a coating selected from the group of fluorides and orthophosphates of the elements aluminum, scandium, yttrium, lanthanum gadolinium and lutetium, the oxides of aluminum, yttrium, silicon and lanthanum and the nitride of aluminum.

DETAILED DESCRIPTION

The Rare Earth Metal-Activated Oxonitridoalumosilicate Phosphor

The present invention focuses on a rare earth metal-activated oxonitridoalumosilicate as a phosphor in any configuration of an illumination system containing a radiation source, including, but not limited to discharge lamps, fluorescent lamps, LEDs, LDs and X-ray tubes. As used herein, the term "radiation" encompasses radiation in the UV, IR and visible regions of the electromagnetic spectrum.

While the use of the present phosphor is contemplated for a wide array of illumination, the present invention is described with particular reference to and finds particular application to phosphor-converted light emitting diodes comprising especially UV- and blue-light-emitting diodes as radiation sources.

The phosphor conforms to the general formula $(Ca_{1-x-y-z}Sr_xBa_yMg_z)_{1-n}(Al_{1-a+b}B_a)Si_{1-b}N_{3-b}O_b{:}RE_n$, wherein $0 \leq x \leq 1$, $0 \leq y \leq 1$, $0 \leq z \leq 1$, $0 \leq a \leq 1$, $0 < b \leq 1$ and $0.002 \leq n \leq 0.2$ and RE is selected from europium(II) and cerium(III).

Figure 2:
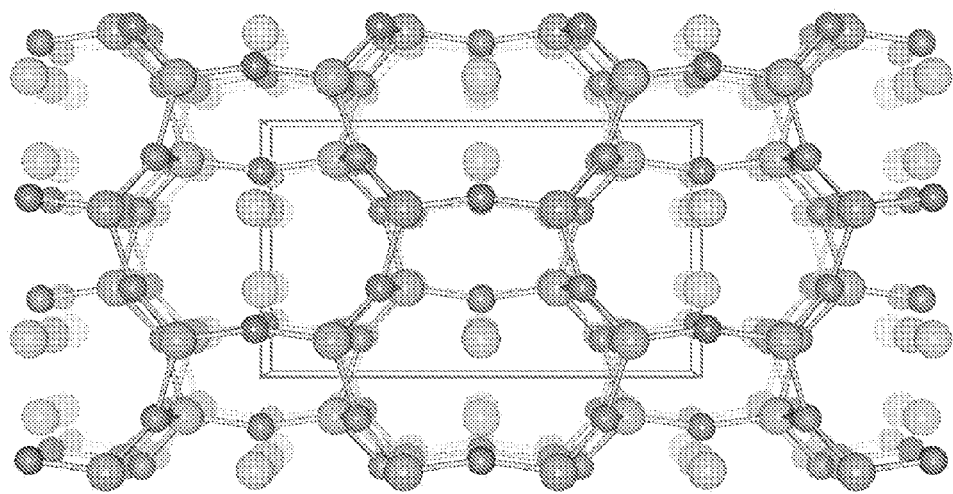
FIG. 2 shows a portion of the crystal structure of $(Ca,RE)Al_{1-x+y}B_xSi_{1-y}N_{3-y}O_y$ in a schematic view.

This class of phosphor material is based on rare earth metal-activated luminescence of an aluminum-substituted oxonitridosilicate. The phosphor comprises a host lattice, wherein the main components are silicon, aluminum, nitrogen and oxygen. The host lattice may also comprise boron. The host layer has a structure comprising stacks of layers of $[(Al,Si)_2N_{6/3}(N,O)_{2/2}]$, wherein silicon and aluminum are tetrahedrically surrounded by oxygen and nitrogen, as shown in FIG. 2.

The N atoms that connect two silicon or aluminum atoms can be substituted by oxygen if the aluminum/silicon ratio is altered simultaneously to maintain charge balance and solid solutions within the system $MAlSiN_3\text{-}MAl_2N_2O$. Thus, oxygen defects that are incorporated in the phosphor material by the precursor materials or the firing atmosphere can be compensated by changing the Al/Si ratio in the precursor mix. A lower defect density in the fluorescent material leads to higher efficiency and better photochemical stability. Within the layers the metal cations such as earth alkaline metals as well as europium(II), cerium(III) and eventually a co-activator are incorporated. They are mainly coordinated by the N atoms that connect two aluminum or silicon atoms or by the substitutional oxygen atoms. Preferably the earth alkaline metals are selected from magnesium, calcium, strontium and barium.

The proportion z of rare earth metal is preferably in a range of $0.002 \leq n \leq 0.2$. When the proportion n is lower, luminance decreases because the number of excited emission centers of photoluminescence due to rare earth metal-cations decreases and, when the n is greater than 0.2, concentration quenching occurs. Concentration quenching refers to the decrease in emission intensity which occurs when the concentration of an activation agent added to increase the luminance of the fluorescent material is increased beyond an optimum level.

The method for producing a microcrystalline phosphor powder of the present invention is not particularly restricted, and it can be produced by any method, which will provide phosphors according to the invention. A series of compositions of general formula of general formula $RE_{3-x}Al_2Al_{3-y}Si_yO_{12-y}N_y{:}Ce_x$, wherein RE is a rare earth metal, selected from the group of yttrium, gadolinium, lutetium, terbium, scandium and lanthanum, and $0.002 \leq x \leq 0.2$ and $0 \leq y \leq 3$ can be manufactured, which form a complete solid solution for the range of $0.002 \leq x \leq 0.2$ and $0 \leq y \leq 3$.

A preferred process for producing a phosphor according to the invention is referred to as the solid-state method. In this process, the phosphor precursor materials are mixed in the solid state and are heated so that the precursors react and form a powder of the phosphor material.

The nitrides of the alkaline earth metals are mixed with amorphous silicon nitride $Si_3N_4$, aluminum nitride AlN powder, the fluorides of europium and/or cerium and a eventually flux in predetermined ratios. The mixture is placed into a high purity molybdenum crucible. The crucibles are loaded into a tube furnace and purged with flowing nitrogen/hydrogen for several hours. The furnace parameters are 10° C./min to 1450° C., followed by a 4 hour dwell at 1450° C. after which the furnace is slowly cooled to room temperature. The samples are once again finely ground before a second annealing step at 1400° C. is performed. Luminous output may be improved through an additional third anneal at slightly lower temperatures in flowing argon. After firing, the powders were characterized by powder X-ray diffraction (Cu, Kα-line), which showed that the desired phase had formed. An amber to red powder is obtained, which efficiently luminesces under UV and blue excitation.

Preferably the europium-activated oxonitridoalumosilicate type phosphors according to the invention may be coated with a thin, uniform protective layer of one or more compounds selected from the group formed by the fluorides and orthophosphates of the elements aluminum, scandium, yttrium, lanthanum gadolinium and lutetium, the oxides of aluminum, yttrium, silicon and lanthanum and the nitride of aluminum.

The protective layer thickness customarily ranges from 0.001 to 0.2 μm and, thus, is so thin that it can be penetrated by the radiation of the radiation source without substantial loss of energy. The coatings of these materials on the phosphor particles can be applied, for example, by deposition from the gas phase or a wet-coating process.

The phosphors according to the invention are, because of their oxonitridoalumosilicate 15 structure, resistant to heat, light and moisture.

When excited by radiation of the UVA or blue range of the electromagnetic spectrum, these rare earth metal-activated oxonitridoalumosilicate phosphors are found to give a broadband emission, with peak wavelength in the amber to deep red range and a tail emission up to the infrared.

Preferably, europium(II) is used as activator. Table 1 gives the spectral data of some europium(II)-activated phosphors.

TABLE 1

| Composition | $E_{m,max}$ | $QE_{450}$ | $RQ_{450}$ | x | y | LE |
|---|---|---|---|---|---|---|
| $CaAlSi(N,O)_3:Eu(2\%)$ | 652 nm | 86.1 | 35.2 | 0.657 | 0.342 | 125.3 |
| $Ca_{0.95}Sr_{0.05}AlSi(N,O)_3:Eu(2\%)$ | 657 nm | 86.8 | 17.3 | 0.68 | 0.318 | 82 |
| $Ca_{0.95}Ba_{0.05}AlSi(N,O)_3:Eu(2\%)$ | 658 nm | 83.5 | 17.5 | 0.676 | 0.323 | 93.2 |
| $CaAl_{0.98}B_{0.02}Si(N,O)_3:Eu(2\%)$ | 650 nm | 81.6 | 19.4 | 0.667 | 0.332 | 108.1 |
| $CaAl_{0.95}B_{0.05}Si(N,O)_3:Eu(2\%)$ | 654 nm | 84.1 | 20.2 | 0.663 | 0.336 | 113 |
| $Ca_{0.95}Mg_{0.05}AlSi(N,O)_3:Eu(2\%)$ | 652 nm | 86.1 | 35.2 | 0.657 | 0.342 | 125.3 |
| $Ca_{0.9}Mg_{0.1}AlSi(N,O)_3:Eu(2\%)$ | 645 nm | 78.3 | 24.9 | 0.63 | 0.368 | 155.5 |
| $Ca_{0.5}Mg_{0.5}AlSi(N,O)_3:Eu(2\%)$ | 633 nm | 70.8 | 36.6 | 0.578 | 0.418 | 222.4 |

Replacing some or all of the europium in an europium-activated oxonitridoalumosilicate by cerium has the effect, that the cerium produces secondary emission that is concentrated in the yellow to amber region of the visible spectrum, instead of a typical broadband secondary emission from europium(II)-activated oxonitridoalumosilicate phosphor that is generally centered in the deep red region of the visible spectrum. Co-activators, such as ytterbium, praseodymium, samarium, terbium, thulium, dysprosium, holmium and erbium may also be used. For charge compensation monovalent cations like alkaline metals may be incorporated into the host-lattice in amounts, which match or are below the amount of Ce(III) present.

Table 2 gives the spectral data of some cerium(III) activated compounds.

TABLE 2

| Composition | $E_{m,max}$ | $QE_{450}$ | $RQ_{450}$ | x | y | LE |
|---|---|---|---|---|---|---|
| $CaAlSiN_3:Ce(2\%)$ | 610 nm | 75.2 | 45.2 | 0.502 | 0.48 | 340 |
| $CaAlSiN_3:Ce, Eu(2\%, 0.1\%)$ | 631 nm | 78.2 | 49.6 | 0.55 | 0.438 | 271.5 |
| $CaAlSiN_3:Ce, Na(2\%, 0.1\%)$ | 564 nm | 76.9 | 54.5 | 0.471 | 0.505 | 383.3 |
| $CaAlSiN_3:Ce(2\%)$ | 571 nm | 82.5 | 43.4 | 0.47 | 0.51 | 400.6 |
| $CaAlSiN_3:Ce(2\%)$ | 569 nm | 81.8 | 39.9 | 0.472 | 0.508 | 399.5 |
| $CaAlSiN_3:Ce(4\%)$ | 583 nm | 74.5 | 26.9 | 0.501 | 0.487 | 366.4 |
| $CaAlSiN_3:Ce, Pr(2\%, 0.5\%)$ | 568 nm | 74.5 | 36.5 | 0.477 | 0.503 | 390.1 |
| $CaAlSiN_3:Ce(2\%)$ w/$SiO_2$ coat | 571 nm | 69.9 | 30.1 | 0.476 | 0.505 | 391.5 |

The Illumination System

The invention also concerns an illumination system comprising a radiation source and a fluorescent material comprising at least one rare earth metal-activated oxonitridoalumosilicate of general formula $(Ca_{1-x-y-z}Sr_xBa_yMg_z)_{1-n}(Al_{1-a+b}B_a)Si_{1-b}N_{3-b}O_b:RE_n$, wherein $0 \leq x \leq 1$, $0 \leq y \leq 1$, $0 \leq z \leq 1$, $0 \leq a \leq 1$, $0 < b \leq 1$ and $0.002 \leq n \leq 0.2$ and RE is selected from europium(II) and cerium(III).

Radiation sources include semiconductor optical radiation emitters and other devices that emit optical radiation in response to electrical excitation. Semiconductor optical radiation emitters include light emitting diode LED chips, light emitting polymers (LEPs), organic light emitting devices (OLEDs), polymer light emitting devices (PLEDs), etc.

Moreover, light-emitting components such as those found in discharge lamps and fluorescent lamps, such as mercury low and high pressure discharge lamps, sulfur discharge lamps, and discharge lamps based on molecular radiators are also contemplated for use as radiation sources with the present inventive phosphor compositions.

In a preferred embodiment of the invention the radiation source is a solid-state light-emitting diode.

Any configuration of an illumination system which includes a solid state LED and a rare earth metal-activated oxonitridoalumosilicate phosphor composition is contemplated in the present invention, preferably with addition of other well-known phosphors, which can be combined to achieve a specific colored amber, red or white light when irradiated by a LED emitting primary UV or blue radiation as specified above.

A detailed construction of one embodiment of such illumination system comprising a radiation source and a fluorescent material shown in FIG. 1 will now be described.

Figure 1:
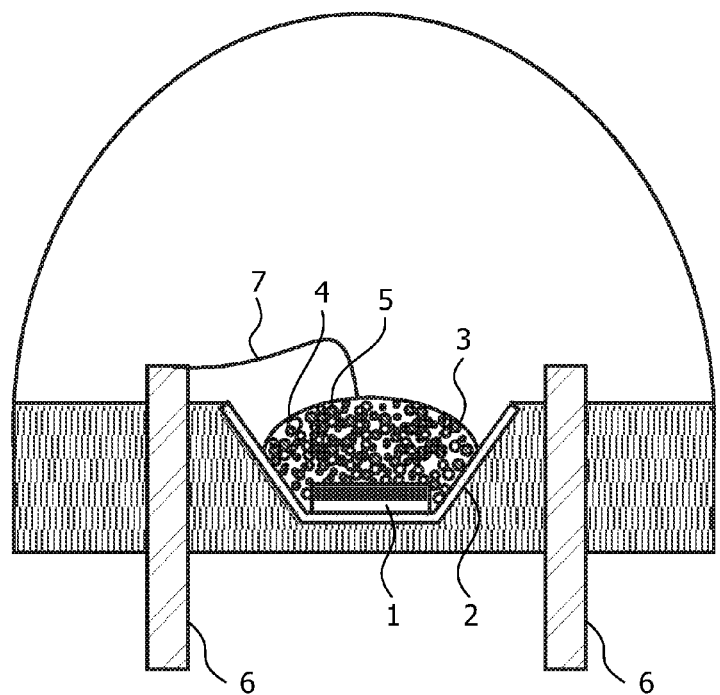
FIG. 1 shows a schematic view of a dichromatic white LED lamp comprising a phosphor of the present invention positioned in a pathway of light emitted by an LED structure.

FIG. 1 shows a schematic view of a chip type light emitting diode with a coating comprising the fluorescent material. The device comprises chip type light emitting diode (LED) 1 as a radiation source. The light-emitting diode die is positioned in a reflector cup lead frame 2. The die 1 is connected via a bond wire 7 to a first terminal 6, and directly to a second electric terminal 6. The recess of the reflector cup is filled with a coating material that contains a fluorescent material 4,5 according to the invention to form a coating layer that is embedded in the reflector cup. The phosphors are applied either separately or in a mixture.

The coating material typically comprises a polymer 3 for encapsulating the phosphor or phosphor blend. In these embodiments, the phosphor or phosphor blend should exhibit high stability properties against the encapsulant. Preferably, the polymer is optically clear to prevent significant light scattering. A variety of polymers are known in the LED industry for making LED lamps.

In one embodiment, the polymer is selected from the group consisting of epoxy and silicone resins. Adding the phosphor mixture to a liquid that is a polymer precursor can perform encapsulation. For example, the phosphor mixture can be a granular powder. Introducing phosphor particles into polymer precursor liquid results in formation of a slurry (i.e. a suspension of particles). Upon polymerization, the phosphor mixture is fixed rigidly in place by the encapsulation. In one embodiment, both the fluorescent material and the LED dice are encapsulated in the polymer.

The transparent coating material may advantageously comprise light-diffusing particles, so-called diffusers.

Examples of such diffusers are mineral fillers, in particular $CaF_2$, $TiO_2$, $SiO_2$, $CaCO_3$ or $BaSO_4$ or else organic pigments. These materials can be added in a simple manner to the above-mentioned resins.

In operation, electrical power is supplied to the die to activate the die. When activated, the die emits the primary light, e.g. blue light. A portion of the emitted primary light is completely or partially absorbed by the fluorescent material in the coating layer. The fluorescent material then emits secondary light, i.e., the converted light having a longer peak wavelength, primarily amber to red in a sufficiently broadband (specifically with a significant proportion of deep red) in response to absorption of the primary light. The remaining unabsorbed portion of the emitted primary light is transmitted through the fluorescent layer, along with the secondary light. The encapsulation directs the unabsorbed primary light and the secondary light in a general direction as output light. Thus, the output light is a composite light that is composed of the primary light emitted from the die and the secondary light emitted from the fluorescent layer.

The color temperature or color point of the output light of an illumination system according to the invention will vary depending upon the spectral distributions and intensities of the secondary light in comparison to the primary light.

Firstly, the color temperature or color point of the primary light can be varied by a suitable choice of the light emitting diode.

Secondly, the color temperature or color point of the secondary light can be varied by a suitable choice of the phosphor in the fluorescent material, the particle size of the phosphor grains and the amount of phosphor applied. Furthermore, these arrangements also advantageously afford the possibility of using phosphor blends in the fluorescent material, as a result of which, advantageously, the desired hue can be set even more accurately.

The White Phosphor Converted Light Emitting Device

According to one aspect of the invention the output light of the illumination system may have a spectral distribution such that it appears to be "white" light. The most popular white LED's consist of blue emitting LED chips that are coated with a phosphor that converts some of the blue radiation to a complimentary color, e.g. a yellow to amber emission. Together the blue and yellow emissions produce white light. There are also white LED's which utilize a UV emitting chip and phosphors designed to convert the UV radiation to visible light. Typically, two or more phosphor emission bands are required.

Blue/Phosphor White LED (Dichromatic White Light Phosphor Converted Light Emitting Device Using Blue Emitting Light Emitting Diode)

In a first embodiment, a white-light emitting illumination system according to the invention can advantageously be produced by choosing the fluorescent material such that a blue radiation emitted by a blue light emitting diode is converted into complementary wavelength ranges, to form dichromatic white light. In this case amber to red light is produced by means of the fluorescent materials that comprise a rare earth metal-activated oxonitridoalumosilicate phosphor. Also a second fluorescent material can be used, in addition, in order to improve the color rendition of this illumination system.

Particularly good results are achieved with a blue LED whose emission maximum lies at 400 to 490 nm. An optimum has been found to lie at 440 nm, taking particular account of the excitation spectrum of the rare earth metal-activated oxonitridoalumosilicate.

When compared with the spectral distribution of the white output light generated by the prior art LED the apparent difference in the spectral distribution is the shift of the peak wavelength which is in the red region of the visible spectrum. Thus, the white output light generated by the illumination system has a significant additional amount of red color, as compared to the output light generated by the prior art LED. (Polychromatic White Light Phosphor Converted Light Emitting Device Using Blue Emitting Light Emitting Diode).

In a second embodiment, a white-light emitting illumination system according to the invention can advantageously be produced by choosing the fluorescent material such that a blue radiation emitted by the blue light emitting diode is converted into complementary wavelength ranges, to form polychromatic white light. In this case, amber to red light is produced by means of the fluorescent materials that comprise a blend of phosphors including rare earth metal-activated oxonitridoalumosilicate phosphor and a second phosphor.

Yielding white light emission with even high color rendering is possible by using additional red and green broad band emitter phosphors covering the whole spectral range together with a blue-emitting LED and a amber to red emitting rare earth metal activated oxonitridoalumosilicate phosphor.

Useful second phosphors and their optical properties are summarized in the following table 3.

TABLE 3

| Composition | $\lambda_{max}$ | x | Y |
|---|---|---|---|
| $(Ba_{1-x}Sr_x)_2SiO_4$:Eu | 523 nm | 0.272 | 0.640 |
| $SrGa_2S_4$:Eu | 535 nm | 0.270 | 0.686 |
| $SrSi_2N_2O_2$:Eu | 541 nm | 0.356 | 0.606 |
| $Y_3Al_5O_{12}$:Ce | 550 nm | 0.447 | 0.535 |
| SrS:Eu | 610 nm | 0.627 | 0.372 |
| $(Sr_{1-x-y}Ca_xBa_y)_2Si_5N_8$:Eu | 615 nm | 0.615 | 0.384 |
| $(Sr_{1-x-y}Ca_xBa_y)_2Si_{5-a}Al_aN_{8-a}O_a$:Eu | 615-650 nm | 0.633 | 0.366 |
| CaS:Eu | 655 nm | 0.700 | 0.303 |
| $(Sr_{1-x}Ca_x)S$:Eu | 610-655 nm | | |

The fluorescent materials may be a blend of two phosphors, an amber to red rare earth metal-activated oxonitridoalumosilicate phosphor and a red phosphor selected from the group $(Ca_{1-x}Sr_x)S$:Eu, wherein $0 \leq x \leq 1$ and $(Sr_{1-x-y}Ba_xCa_y)_2Si_{5-a}Al_aN_{8-a}O_a$:Eu wherein $0 \leq a \leq 5$, $0 \leq x \leq 1$ and $0 \leq y \leq 1$.

The fluorescent materials may be a blend of two phosphors, e.g. an amber to red rare earth metal-activated oxonitridoalumosilicate phosphor and a green phosphor selected from the group comprising $(Ba_{1-x}Sr_x)_2SiO_4$:Eu, wherein $0 \leq x \leq 1$, $SrGa_2S_4$:Eu and $SrSi_2N_2O_2$:Eu.

The hue (color point in the CIE chromaticity diagram) of the white light thereby produced can in this case be varied by a suitable choice of the phosphors in respect of mixture and concentration.

UV/Phosphor White LED (Dichromatic white phosphor converted light emitting device using UV-emitting light) In a further embodiment, a white-light emitting illumination system according to the invention can advantageously be produced by choosing the fluorescent material such that a UV radiation emitted by the UV light emitting diode is converted into complementary wavelength ranges, to form dichromatic white light. In this case, the amber and blue light is produced by means of the fluorescent materials. Amber light is produced by means of the fluorescent materials that comprise a rare earth metal-activated oxonitridoalumosilicate phosphor. Blue light is produced by means of the fluorescent materials that comprise a blue phosphor selected from the group comprising $BaMgAl_{10}O_{17}$:Eu, $Ba_5SiO_4(Cl,Br)_6$:Eu, $CaLn_2S_4$:Ce and (Sr,Ba,Ca)$_5$(PO$_4$)$_3$Cl:Eu. Particularly good results are achieved in conjunction with a UVA light emitting diode, whose emission maximum lies at 200 to 400 nm. An optimum has been found to lie at 365 nm, taking particular account of the excitation spectrum of the rare earth metal activated oxonitridoalumosilicate.

Polychromatic White Phosphor Converted Light Emitting Device Using UV Emitting-LED In a further embodiment, a white-light emitting illumination system according to the invention can advantageously be produced by choosing the fluorescent material such that UV radiation emitted by a UV emitting diode is converted into complementary wavelength ranges, to form polychromatic white light e.g. by additive color triads, for example blue, green and red.

In this case, the amber to red, the green and blue light is produced by means of the fluorescent materials.

Also a second red fluorescent material can be used, in addition, in order to improve the color rendition of this illumination system.

Yielding white light emission with even higher color rendering is possible by using blue and green broad band emitter phosphors covering the whole spectral range together with a UV emitting LED and an amber to red emitting rare earth metal-activated oxonitridoalumosilicate phosphor.

The hue (color point in the CIE chromaticity diagram) of the white light thereby produced can in this case be varied by a suitable choice of the phosphors in respect of mixture and concentration.

The Amber to Red Phosphor Converted Light Emitting Device

According to one preferred aspect of the invention an illumination system that emits output light having a spectral distribution such that it appears to be amber or red light is provided.

Fluorescent material comprising rare earth metal-activated oxonitridoalumosilicate according to the invention as phosphor is particularly well suited as an amber or red component for stimulation by a primary UVA or blue radiation source such as, for example, an UVA-emitting LED or blue-emitting LED.

It is possible thereby to implement an illumination system emitting in the amber to red regions of the electromagnetic spectrum.

In a first embodiment, a amber to red-light emitting illumination system according to the invention can advantageously be produced by choosing the fluorescent material such that a blue radiation emitted by the blue light emitting diode is converted to amber or red light.

In this case, colored light is produced by means of the fluorescent materials that comprise a rare earth metal-activated oxonitridoalumosilicate phosphor according to the invention.

Particularly good results are achieved with a blue LED the emission maximum of which lies at 400 to 495 nm. An optimum has been found to lie at 445 to 465 nm, taking particular account of the excitation spectrum of the oxonitridoalumosilicate phosphor.

The color output of the LED-phosphor system is very sensitive to the thickness of the phosphor layer. If the phosphor layer is thick and comprises an excess of an amber or red emitting rare earth metal-activated oxonitridoalumosilicate phosphor, then a lesser amount of the blue LED light will penetrate through the thick phosphor layer. The combined LED-phosphor system will then appear amber to red, because it is dominated by the amber to red secondary light of the phosphor. Therefore, the thickness of the phosphor layer is a critical variable affecting the color output of the system.

The hue (color point in the CIE chromaticity diagram) of the amber to red light thereby produced can in this case be varied by a suitable choice of the phosphor in respect of mixture and concentration.

The color points of the illumination systems according to this embodiment are in the amber to red spectral range in the chromaticity diagram of the Commission internationale de l'eclairage ("CIE").

A red-light emitting illumination system according to the invention can particularly preferably be realized by admixing an excess of the inorganic fluorescent material $(Ca_{0.95}Sr_{0.05})_{0.98}Al_{1.04}Si_{0.96}N_{2.96}O_{0.04}$:Eu$_{0.02}$ with a silicon resin used to produce the luminescence conversion encapsulation or layer. Most of a blue radiation emitted by a 462 nm InGaN light emitting diode is shifted by the inorganic fluorescent material $(Ca_{0.95}Sr_{0.05})_{0.98}Al_{1.04}Si_{0.96}N_{2.96}O_{0.04}$:Eu$_{0.02}$ into the red spectral region. A human observer perceives the combination of the remaining blue primary light and the excess secondary light of the phosphor as red light.

Figure 3:
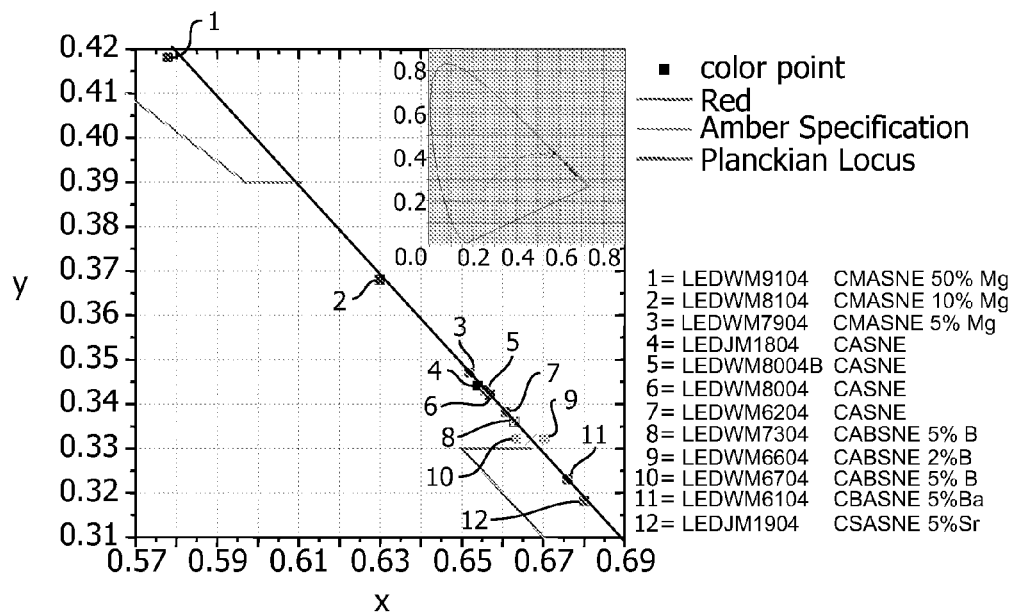
FIG. 3 shows the C.I.E. chromaticity diagram with the color points of fluorescent materials according to the invention and the color points of the fluorescent materials.
Figure 4:
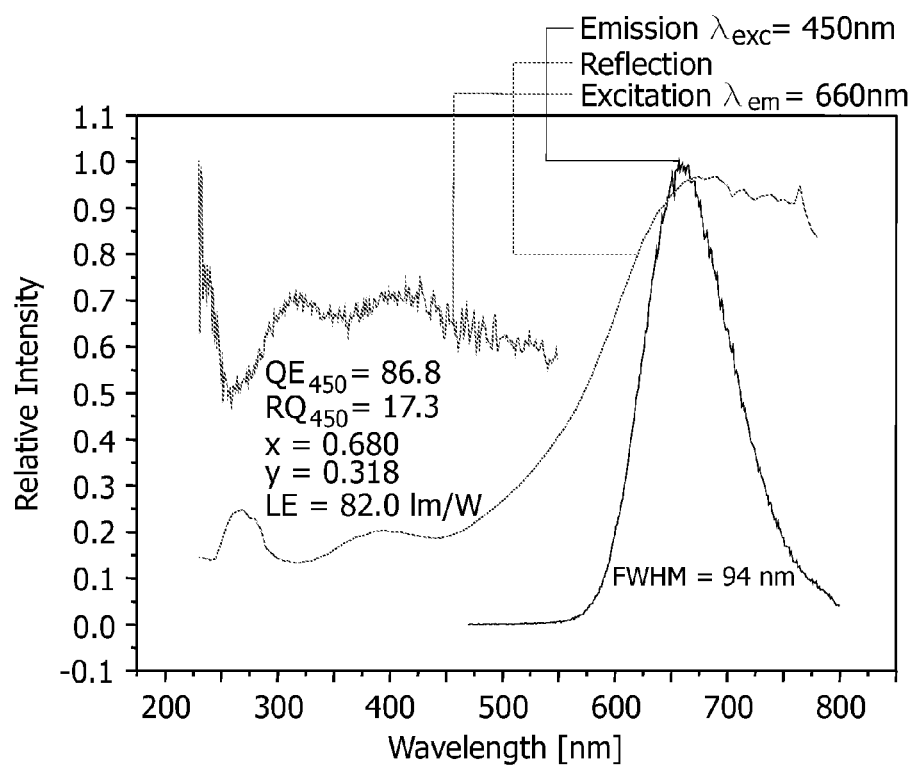
FIG. 4 shows the excitation, emission and reflection spectra of $(Ca_{0.95}Sr_{0.05})_{0.98}Al_{1.04}Si_{0.96}N_{2.96}O_{0.04}{:}Eu_{0.02}.$

Amber to red LEDs with a color point on the line connecting x=0.58, y=0.42 and x=0.69, y=0.31 can be realized by this single phosphor dichromatic concept, if the appropriate member of the composition according to the formula $(Ca_{1-x-y-z}Sr_xBa_yMg_z)_{1-n}(Al_{1-a+b}B_a)Si_{1-b}N_{3-b}O_b$:RE$_n$ is chosen, as shown in FIG. 3.

In a second embodiment, colored-light emitting illumination system according to the invention can advantageously be produced by choosing the fluorescent material such that a blue radiation emitted by the blue light emitting diode is converted into complementary wavelength ranges, to form polychromatic amber or red light. In this case, colored light is produced by means of the fluorescent materials that comprise a blend of phosphors including rare earth metal-activated oxonitridoalumosilicate phosphor and a second phosphor.

Useful second phosphors and their optical properties are summarized in the following table 4:

TABLE 4

| Composition | $\lambda_{max}$ | x | y |
|---|---|---|---|
| $(Ba_{1-x}Sr_x)_2SiO_4$:Eu | 523 nm | 0.272 | 0.640 |
| SrGa$_2$S$_4$:Eu | 535 nm | 0.270 | 0.686 |
| SrSi$_2$N$_2$O$_2$:Eu | 541 nm | 0.356 | 0.606 |
| Y$_3$Al$_5$O$_{12}$:Ce | 550 nm | 0.447 | 0.535 |
| SrS:Eu | 610 nm | 0.627 | 0.372 |
| $(Sr_{1-x-y}Ca_xBa_y)_2Si_5N_8$:Eu | 615 nm | 0.615 | 0.384 |
| $(Sr_{1-x-y}Ca_xBa_y)_2Si_{5-a}Al_aN_{8-a}O_a$:Eu | 615-650 nm | 0.633 | 0.366 |
| CaS:Eu | 655 nm | 0.700 | 0.303 |
| $(Sr_{1-x}Ca_x)S$:Eu | 610-655 nm | | |

In a further aspect of the invention, an amber or red-light emitting illumination system according to the invention can advantageously be produced by choosing the fluorescent material such that a UV radiation emitted by the UV emitting diode is converted entirely into monochromatic amber to red light. In this case, the amber to red light is produced by means of the fluorescent materials.

In a first embodiment, an amber to red-light emitting illumination system according to the invention can advantageously be produced by choosing the fluorescent material such that a blue radiation emitted by the UV light emitting diode is converted into complementary wavelength ranges, to form dichromatic colored, especially amber or red, light.

In this case, colored light is produced by means of the fluorescent materials that comprise a rare earth metal-activated oxonitridoalumosilicate phosphor.

Particularly good results are achieved with a UV-LED whose emission maximum lies at near UV from 370 to 430 nm.

The color output of the illumination system comprising an UV-LED as radiation source is not very sensitive to the thickness of the phosphor layer. Therefore, the thickness of the phosphor layer is a not critical variable affecting the color output of the system and may be reduced.

The hue (color point in the CIE chromaticity diagram) of the amber or red light thereby produced can in this case be varied by a suitable choice of the phosphor in respect of mixture and concentration.

The color points of the illumination systems according to this embodiment are in the amber to red spectral range in the chromaticity diagram of the Commission internationale de l'eclairage ("CIE").

In many of the examples described above, multiple phosphors are included in a single illumination system. When some phosphors are mixed together, interaction between the mixed phosphors may adversely affect the efficiency and spectrum of the device. For example, amber-to-red emitting phosphors may absorb much of the light emitted by yellow-to-green emitting phosphor. Accordingly, depending on the phosphors in the combination, the phosphors may be formed as separate, discrete layers, or mixed and formed as a single layer. The preferred phosphor arrangement may depend on the excitation and emission spectra of the phosphors and on the application. Also, the phosphor arrangement may be chosen to maximize a particular property of the combined spectrum, such as, for example, the color rendering index, given as CRI or Ra, the color gamut, or the luminous equivalent. The luminous equivalent is the highest efficiency possible for a given spectrum and is expressed in lumens/W.

In a variation of the device illustrated in FIG. 1, multiple phosphors may be formed as discrete layers disposed next to each other in a reflector cup. For example, a yellow-to-green emitting phosphor may be mixed with a resin, silicone, or other transparent material and disposed on one side of the reflector cup, while any other phosphors, including an amber-to-red emitting phosphor, are mixed separately with a resin, silicone, or other transparent material and disposed on the other side of reflector cup, such that the slurry containing the yellow-to-green emitting phosphor does not appreciably mix with the slurry containing the amber-to-red emitting phosphor. The viscosity of the transparent material forming the slurries may be selected to avoid mixing the two slurries. Since the yellow-to-green emitting phosphor and any other phosphors are adjacent to each other, rather than mixed in the same slurry, light emitted by yellow-to-green emitting phosphor is less likely to be absorbed by any amber-to-red emitting phosphors in the other slurry.

Figure 5:
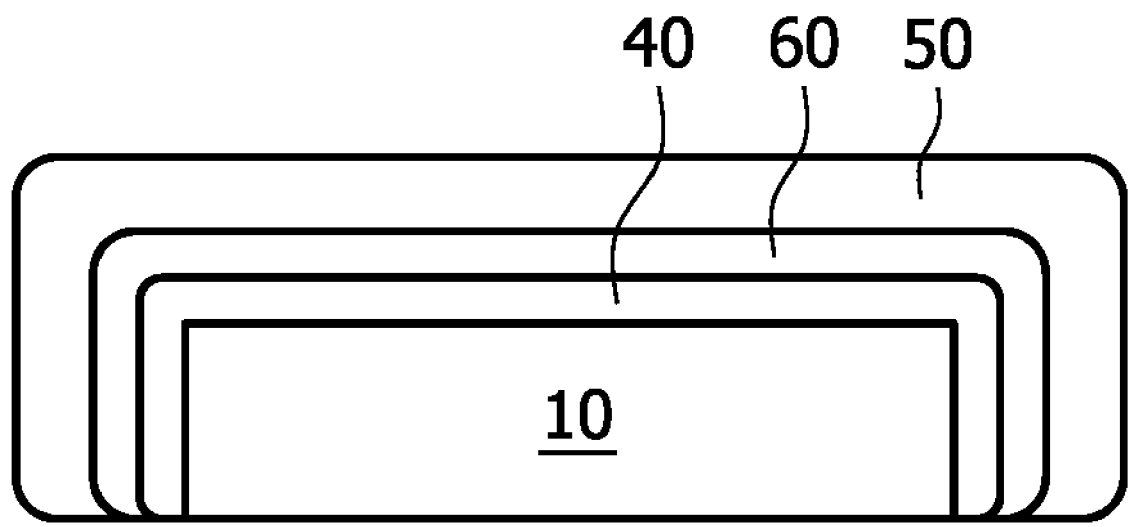
FIG. 5 shows a cross sectional view of an alternative embodiment of an illumination system including an LED and a phosphor positioned in the pathway of light emitted by the LED.

FIG. 5 shows an alternative embodiment of an illumination system with multiple phosphors, where different phosphors are deposited over the LED as discrete layers. Phosphor layer 40, including any amber-to-red emitting phosphors, is deposited closest to LED 10. Yellow-to-green emitting phosphor 50 is then deposited over phosphor layer 40. Phosphor layers 40 and 50 may be separated by an optional transparent layer 60. Though phosphor layers 40 and 50 are shown covering the sides of LED 10, for design considerations or depending on the technique used to form the phosphor layer, one or both of phosphor layers 40 and 50 may not cover the entire top surface of LED 10, and/or may not extend over the sides of LED 10.

Phosphor layers 40 and 50 may be formed as ceramics as described in U.S. Published Application 2005/0269582; deposited as slurries in a resin or other transparent material; deposited as thin films by, for example, electron beam evaporation, thermal evaporation, rf-sputtering, chemical vapor deposition, or atomic layer epitaxy; or deposited as conformal layers over LED 10 by, for example, screen printing, stenciling as described in U.S. Pat. No. 6,650,044, or by electrophoretic deposition as described in U.S. Pat. No. 6,576,488. Thin films are described in more detail in U.S. Pat. No. 6,696,703. Each of U.S. Published Application 2005/0269582, U.S. Pat. No. 6,696,703, U.S. Pat. No. 6,650,044 and U.S. Pat. No. 6,576,488 are incorporated herein by reference. In contrast to a thin film, which typically behaves as a single, large phosphor particle, the phosphor in a conformal layer generally behaves as multiple phosphor particles. In addition a thin film typically contains no materials other than phosphor. A conformal layer often includes materials other than phosphor, such as, for example, silica. Phosphor layers 40 and 50 need not be formed by the same technique. For example, a first phosphor may be formed as a ceramic layer or a conformal layer disposed on the LED, which is then coated with a slurry including a second phosphor.

One or more dichroic filters may be included in the device. For example, a dichroic filter designed to transmit light emitted by LED 10 but to reflect light emitted by phosphors 40 and 50 may be included between LED 10 and phosphor layer 40. Layer 60 between yellow-to-green emitting phosphor 50 and amber-to-red emitting phosphor 40 may be a dichroic filter designed to transmit light emitted by amber-to-red emitting phosphor 40 and LED 10, and reflect light emitted by yellow-to-green emitting phosphor 50. Dichroic filters may reduce the amount of radiation back-scattered by phosphor layers 40 and 50 into LED 10, where it can be absorbed.

As an alternative to the device of FIG. 5, the yellow-to-green emitting phosphor and other phosphors may be deposited on the LED in a plurality of small regions, which may form a pattern, such as a checkerboard pattern. Patterns of different phosphor layers may be formed by depositing a first layer of phosphor by electrophoretic deposition, patterning that layer using conventional lithography and etching techniques, then depositing a second phosphor layer by electrophoretic deposition. Alternatively, patterns of phosphor layers may be deposited by screen printing or ink jet printing. In some embodiments, a pattern of phosphor layers may be formed by pipetting the individual phosphor mixes into wells in a clear plastic microplate used for microbiology. The phosphor-filled microplate is then placed on the LED. Phosphor-filled microplates may be formed separately from the LED. Alternatively, a plurality of small regions of one phosphor may be formed on the surface of the LED, then a layer of a second phosphor may be deposited over the plurality of regions of the first phosphor.

Devices including multiple phosphors formed as discrete layers is described in more detail in U.S. Published Application 2005/0184638, which is incorporated herein by reference.

Example

In one example, a rare earth metal-activated oxonitridoalumosilicate of general formula $(Ca_{1-y-z}Sr_xBa_yMg_z)_{1-n}(Al_{1-a+b}B_a)Si_{1-b}N_{3-b}O_b:RE_n$, wherein $0 \leq x \leq 1$, $0 \leq y \leq 1$, $0 \leq z \leq 1$, $0 \leq a \leq 1$, $0 < b \leq 1$ and $0.002 \leq n \leq 0.2$ and RE is selected from europium(II) and cerium(III) is configured to emit red light and is combined with an LED configured to emit blue light, for example at a peak wavelength of about 450 nm, and a $Y_3Al_5O_{12}:Ce^{3+}$ phosphor configured to emit yellow light. Unconverted blue light from the light emitting diode mixes with light emitted by the two phosphors such that the composite light appears white. Such a white light device offers several benefits.

First, red-emitting $(Ca_{1-x-y-z}Sr_xBa_yMg_z)_{1-n}(Al_{1-a+b}B_a)Si_{1-b}N_{3-b}O_b:RE_n$ does not degrade when used in high humidity environments, even without a coating against moisture. Other red-emitting phosphors exhibit a decrease in quantum efficiency when left uncoated and used in a high humidity environment.

Second, red-emitting $(Ca_{1-x-y-z}Sr_xBa_yMg_z)_{1-n}(Al_{1-a+b}B_a)Si_{1-b}N_{3-b}O_b:RE_n$ is stable when driven at high current or operated at high temperature. As the drive current increases in devices including other red-emitting phosphors such as CaS, the height of the blue peak in the spectrum relative to the red peak increases, indicating that the phosphor absorbs fewer photons as the drive current increases, and therefore becomes less efficient. In contrast, in a white light device including a red-emitting $(Ca_{1-x-y-z}Sr_xBa_yMg_z)_{1-n}(Al_{1-a+b}B_a)Si_{1-b}N_{3-b}O_b:RE_n$, the relative sizes of the red and blue peaks do not significantly change as the drive current increased to 4 A in a 1 mm$^2$ device, when at a temperature less than 200° C.

Third, red-emitting $(Ca_{1-x-y-z}Sr_xBa_yMg_z)_{1-n}(Al_{1-a+b}B_a)Si_{1-b}N_{3-b}O_b:RE_n$ may be configured to emit deeper red light than other red-emitting phosphors, which may improve the color rendering of a device including a blue-emitting LED, red-emitting $(Ca_{1-x-y-z}Sr_xBa_yMg_z)_{1-n}(Al_{1-a+b}B_a)Si_{1-b}N_{3-b}O_b:RE_n$ and a yellow-emitting phosphor such as $Y_3Al_5O_{12}:Ce^{3+}$. For example, a device including a blue-emitting LED, red-emitting $(Ca_{1-x-y-z}Sr_xBa_yMg_z)_{1-n}(Al_{1-a+b}B_a)Si_{1-b}N_{3-b}O_b:RE_n$ and $Y_3Al_5O_{12}:Ce^{3+}$ emits light having a color rendering index Ra greater than 85 and a value R9, which is an indication of the amount of deep red emission, greater than 40 at a color temperature CCT between 3000 and 3500K. Higher Ra and R9 values indicate better color rendering. In contrast, a Warm White LED available from Nichia Corporation emits light having a color rendering index Ra of only 74 and an R9 value of zero at a color temperature less than 2800 K, indicating poor color rendering and very little deep red emission. Red-emitting $(Ca_{1-x-y-z}Sr_xBa_yMg_z)_{1-n}(Al_{1-a+b}B_a)Si_{1-b}N_{3-b}O_b:RE_n$ phosphors may thus be used to make devices emitting composite light having a Ra of at least 80 and an R9 of at least 20.

Fourth, red-emitting $(Ca_{1-x-y-z}Sr_xBa_yMg_z)_{1-n}(Al_{1-a+b}B_a)Si_{1-b}N_{3-b}O_b:RE_n$ may be efficiently combined with other phosphors in white-light emitting devices. For example, a device combining red-emitting $(Ca_{1-x-y-z}Sr_xBa_yMg_z)_{1-n}(Al_{1-a+b}B_a)Si_{1-b}N_{3-b}O_b:RE_n$ with $Y_3Al_5O_{12}:Ce^{3+}$ and a blue-emitting LED emits a combined spectrum with a higher luminous equivalent than is predicted by a simple simulation assuming a superposition of the individual spectra of the LED and the two phosphors. Accordingly, the interactions between red-emitting $(Ca_{1-x-y-z}Sr_xBa_yMg_z)_{1-n}(Al_{1-a+b}B_a)Si_{1-b}N_{3-b}O_b:RE_n$ and $Y_3Al_5O_{12}:Ce^{3+}$ do not reduce the expected efficiency of the device, and may enhance it.

In some embodiments, a $(Ca_{1-x-y-z}Sr_xBa_yMg_z)_{1-n}(Al_{1-a+b}B_a)Si_{1-b}N_{3-b}O_b:RE_n$ phosphor may be synthesized as described below. The use of fluxes, i.e. additives that form liquid phases at elevated temperatures during synthesis, is a method in solid-state synthesis for lowering synthesis temperatures and improving particle morphology and crystallinity. In general the choice of an appropriate flux is limited to compounds with melting points close to the synthesis temperature, which either evaporate from the synthesis mixture or can be incorporated into the crystal lattice of the target phosphor. In the case of a $CaAlSiN_3:Eu$ phosphor, salts like $CaF_2$ or $SrF_2$ may be used, since the melting points of $CaF_2$ and $SrF_2$ are 1402° C. and 1463° C., respectively and Ca, Sr and F are readily incorporated into the $CaAlSiN_3$ crystal structure. Potential drawbacks to using fluxes include possible changes in the color point of the spectrum emitted by the phosphor, as well as the formation of defects due to fluoride uptake of the host lattice.

Surprisingly, the inventors have discovered that in addition to $CaF_2$ or $SrF_2$, $NH_4Cl$ and $NaCl$, which melt at 300° C. and 800° C., respectively, also work well as fluxes. As both compounds have high vapor pressures at the synthesis temperature of $CaAlSiN_3$, they are not incorporated into the crystal lattice of the target compound, and thus may avoid the potential drawbacks of $CaF_2$ and $SrF_2$.

For example, $(Ca_{0.95},Sr_{0.05})AlSiN_3:Eu$ (2%) was synthesised as follows: all actions are carried out in dry inert gas atmosphere. 4.099 g AlN (Tokuyama, Tokyo, Japan), 4.942 g $Ca_3N_2$ (ESPI, Ashland, Oreg. USA), 0.352 g $Eu_2O_3$ (Alfa Aesar, Karlsruhe, Germany), 4.732 g $Si_3N_4$ (UBE Europe GmbH, Düsseldorf, Germany) and 0.448 g $SrH_2$ (Alfa Aesar, Karlsruhe, Germany) are weighed into an agate milling jar. 35 mL Tetrahydrofuran (Aldrich, Taufkirchen, Germany) and 20 agate milling balls (diameter 5 mm) are added. The powders are milled in a planetary ball mill at 200 rpm for 20 minutes. The dried mixture is transferred into a SiC crucible with lid and fired at 1300° C. for 4 hours. The pre-reacted powder is collected, 1% w/w flux is added and the ball milling is repeated. The mixture with flux is transferred back into the SiC crucible with lid and fired for a second time at 1600° C. for 4 hours. The final reaction product is of light red color and stable in ambient air. It is deagglomerated using the planetary ball mill and then washed with acetic acid, water and ethanol.

Using this recipe five powders were obtained using different fluxes: A: $NH_4Cl$; B: $CaF_2$; C: $SrF_2$; D: $NaCl$; and E: no flux. Table 5 illustrates the spectral properties obtained for the 5 examples. In table 5, $QE_{450}$ refers to the quantum efficiency at 450 nm excitation, $RQ_{450}$ refers to the reflection at 450 nm, x and y refer to coordinates on the 1931 CIE chromaticity chart, and LE refers to the lumen equivalent. Particularly favorable properties (such as low $RQ_{450}$, high $QE_{450}$, high x, and low y chromaticity coordinates) are observed for samples A, D and E. The good absorption and deep red color point of example A are favorable for some of the examples and embodiments described above.

TABLE 5

Spectral properties of $(Ca_{0.95}, Sr_{0.05})AlSiN_3:Eu$ (2%) powders prepared using different fluxes.

| Sample | $QE_{450}$ (%) | $RQ_{450}$ (%) | x | y | LE (lm/W) |
|---|---|---|---|---|---|
| A | 86.4 | 24.9 | 0.663 | 0.336 | 112.5 |
| B | 88.3 | 30.6 | 0.648 | 0.350 | 133.1 |
| C | 85.5 | 30.1 | 0.649 | 0.349 | 130.5 |
| D | 84.2 | 29.3 | 0.653 | 0.346 | 128.7 |
| E | 87.1 | 27.0 | 0.657 | 0.342 | 121.1 |

The above synthesis technique for $CaAlSiN_3:Eu$ may avoid problems with other techniques caused by the loss of Ca from the compound at elevated temperatures. The loss of Ca may result in impaired optical properties of the resulting material, due to defects in the host lattice. Gaseous Ca may also corrode furnace equipment. The above synthesis technique avoids formation of gaseous Ca without undesirably lowering firing temperatures and without requiring synthesis in pressurised furnaces, both of which may have drawbacks. For example, lower firing temperatures may result in less crystalline finer grained particles, usually having lower absorption at the excitation wavelength and lower light yields in the final devices; and the use of pressurised furnace equipment generally increases the difficulty of production as well as production and energy costs.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A method of forming a phosphor comprising a rare earth metal-activated oxonitridoalumosilicate of general formula $(Ca_{1-x-y-z}Sr_xBa_yMg_z)_{1-n}(Al_{1-a+b}B_a)Si_{1-b}N_{3-b}O_b{:}RE_n$, wherein $0 \leq x \leq 1$, $0 \leq y \leq 1$, $0 \leq z \leq 1$, $0 \leq a \leq 1$, $0 < b \leq 1$ and $0.002 \leq n \leq 0.2$ and RE is selected from europium(II) and cerium(III), the method comprising: milling precursor material with a flux; and firing the precursor material and the flux at a first temperature; wherein: the first temperature is greater than room temperature; and the flux forms a liquid phase at the first temperature.

2. The method of claim 1 wherein the flux comprises $NH_4Cl$.

3. The method of claim 1 wherein the flux is selected from a group including $CaF_2$, $SrF_2$, and NaCl.

* * * * *